US007816908B2

(12) United States Patent
Nishinosono

(10) Patent No.: US 7,816,908 B2
(45) Date of Patent: Oct. 19, 2010

(54) DISPLAY DEVICE AND LIQUID CRYSTAL TELEVISION

(75) Inventor: Kazuo Nishinosono, Osaka (JP)

(73) Assignee: Funai Electric Co., Ltd., Daito-shi, Osaka (JP)

(*) Notice: Subject to any disclaimer, the term of this patent is extended or adjusted under 35 U.S.C. 154(b) by 267 days.

(21) Appl. No.: 12/150,356

(22) Filed: Apr. 28, 2008

(65) Prior Publication Data

US 2008/0272798 A1 Nov. 6, 2008

(30) Foreign Application Priority Data

May 1, 2007 (JP) ............................ 2007-120714

(51) Int. Cl.
*G01R 31/00* (2006.01)

(52) U.S. Cl. .................................... 324/158.1; 324/770

(58) Field of Classification Search ....................... None
See application file for complete search history.

(56) References Cited

U.S. PATENT DOCUMENTS

| | | | | |
|---|---|---|---|---|
| 3,931,633 | A * | 1/1976 | Shannon et al. | 257/10 |
| 5,914,871 | A * | 6/1999 | Lin et al. | 363/131 |
| 7,595,785 | B2 * | 9/2009 | Jang | 345/102 |
| 2007/0159743 | A1 * | 7/2007 | Flores Losada | 361/54 |
| 2008/0273125 | A1 * | 11/2008 | Nishinosono | 348/790 |

FOREIGN PATENT DOCUMENTS

| | | |
|---|---|---|
| JP | H09-090317 A | 4/1997 |
| JP | 10-301535 | 11/1998 |
| JP | 2003-216127 | 7/2003 |
| JP | 2004-126437 | 4/2004 |

OTHER PUBLICATIONS

The extended European search report dated Jan. 7, 2010.
Sharp Corporation "Service Manual SE00LC26GA600", Sep. 16, 2005.

* cited by examiner

*Primary Examiner*—Paresh Patel
(74) *Attorney, Agent, or Firm*—Yokoi & Co., U.S.A., Inc.; Toshiyuki Yokoi

(57) ABSTRACT

The present invention discloses enabling readily determining which circuit, among a plurality of circuits including an optical source lighting circuit and a power supply circuit, has a failure and repairing the circuits easily in a short period. A liquid crystal television 100 comprising a power supply circuit 24 that produces and outputs various power supply voltages from an inputted commercial AC power supply, a microcomputer 22 that outputs a control signal to a plurality of circuits, respectively, including at least the power supply circuit 24 and an inverter circuit 26 that is driven by a power supply voltage output by the power supply circuit 24 to controls turning on and off of each circuit, is provided with an input terminal 53 for providing a power supply voltage from the outside of the liquid crystal television 100, and an inspection auxiliary circuit 50 connected to the power supply circuit 24 and inverter circuit 26, generating a constant voltage that starts the power supply circuit 24 and inverter circuit 26 when a power supply voltage is provided from the input terminal 53 and outputs the constant voltage as a control signal.

6 Claims, 5 Drawing Sheets

DISPLAY DEVICE AND LIQUID CRYSTAL TELEVISION

CROSS-REFERENCES TO RELATED APPLICATIONS

The present application is related to the Japanese Patent Application No. 2007-120714, filed May 1, 2007, the entire disclosure of which is expressly incorporated by reference herein.

BACKGROUND OF THE INVENTION

1. Field of the Invention

The present invention relates to a display device and a liquid crystal television, particularly to a display device and a liquid crystal television that comprise a power supply circuit that produces and outputs various power supply voltages from an inputted commercial AC power supply, and a control unit that outputs a control signal to a plurality of circuits, respectively, to control startup and shutdown of the circuits, the plurality of circuits comprising at least the power supply circuit and an optical source lighting circuit that is driven by the power supply voltage.

2. Description of Related Art

Circuitry of a display device is normally constituted by combining a plurality of circuits. When there is a failure in any of these circuits and the display device cannot be started, it is necessary to replace the entire circuit board or determine that circuit has a failure. For example, in case of a liquid crystal television, when the screen remains black and no image appears even if the power switch is turned on, possible causes lie in a tuner circuit, a video processing circuit, a backlight inverter circuit and various other circuits. Such a failure has been conventionally repaired by replacing each block circuit board or determining the faulty portion by checking voltages and waveforms one by one referring to circuit diagrams.

Japanese Unexamined Patent Publication Nos. H10-301535, 2003-216127 and 2004-126437 disclose techniques of providing a video display device with two types of power supplies: a battery power supply and an external power supply, in which when there is no input from the external power supply, the battery power supply is used as the power source.

BRIEF SUMMARY OF THE INVENTION

However, the techniques disclosed in Japanese Unexamined Patent Publication Nos. H10-301535, 2003-216127 and 2004-126437 are not for determining which circuit is faulty when a failure occurs.

The present invention is to provide a display device and a liquid crystal television in which the circuits can be repaired easily in a short period by enabling readily determining which of the plurality of circuits is faulty.

In order to solve the above problems, the present invention discloses a display device, comprising a power supply circuit that generates and outputs power supply voltages from an input commercial alternate current (AC) power supply; a control unit that outputs a control signal to a plurality of circuits to respectively turn ON and OFF the plurality of circuits; the plurality of circuits comprising at least the power supply circuit and an optical source lighting circuit that is driven by the power supply voltage; the display device, includes: an input terminal for providing a power supply voltage from an outside of the display device, and an inspection auxiliary circuit coupled with the power supply circuit and the optical source lighting circuit, generating a constant voltage for starting the power supply circuit and the optical source lighting circuit when the power supply voltage is provided from the input terminal, and outputting the constant voltage as a control signal.

That is, when a power supply voltage is provided from the outside of the display device to the input terminal, a constant voltage is generated in the inspection auxiliary circuit, and the generated constant voltage is input as a control signal to the power supply circuit and the optical source lighting circuit. The power supply circuit into which the control signal is input provides the optical source lighting circuit with a drive voltage, and the optical source lighting circuit into which the drive voltage and control signal are input turns the light source on. At this time, if either of the power supply circuit and the optical source lighting circuit has a failure, the light source is not turned on.

The display device of the present invention may also have such a constitution that a circuit that generates the constant voltage and the power supply circuit are connected by a diode so that reverse current from the power supply circuit to the circuit that generates the constant voltage is prevented, and the circuit that generates the constant voltage and the optical source lighting circuit are connected by a diode so that reverse current from the optical source lighting circuit to the circuit that generates the constant voltage is prevented.

Specifically, the diode prevents reverse current to the inspection auxiliary circuit. Therefore, even if a voltage higher than the constant voltage is remaining or generating in the optical source lighting circuit and the power supply circuit, this high voltage does not affect the inspection auxiliary circuit and the source of the external power supply voltage.

The circuit that generates the constant voltage in the display device of the present invention may also have such a constitution that comprises a transistor, a resistor that self-biases the transistor, and a first Zener diode whose cathode is connected to the base of the transistor and anode is grounded to determine a base voltage.

The display device of the present invention may also have such a constitution that comprises a second Zener diode whose cathode is connected to a collector of the transistor and anode is grounded to determine the upper limit of the collector voltage of the transistor. That is, when the breakdown voltage of the second Zener diode is such that can be input to the inspection auxiliary circuit and a voltage equal to or higher than this breakdown voltage is input from the outside, the second Zener diode breaks down to prevent the application of an excessively high voltage to the transistor, and therefore to the power supply circuit and a control signal input line of the optical source lighting circuit.

Moreover, the display device of the present invention is a liquid crystal television comprising an externally-excited inverter circuit and a backlight that is lit by the externally-excited inverter circuit, and may have such a constitution that the externally-excited inverter circuit constituting the optical source lighting circuit comprises a switching circuit that applies an AC voltage to the primary winding of a step-up transformer, and a control circuit that oscillates a predetermined frequency signal at a duty corresponding to the luminance control signal when a control signal that commands to turn on oscillation and a luminance control signal that designates a duty are input, and performs switching control of the switching circuit at the frequency of the frequency signal, and the inspection auxiliary circuit outputs a control signal to the power supply circuit and the control signal and the luminance control signal are output to the control circuit.

Further, as a more specific example of the display device of the present invention discloses a liquid crystal television, comprising: an externally-excited inverter circuit that converts a direct current (DC) input voltage into an alternate current (AC) output voltage by an externally-excited switching circuit; a power supply circuit that provides the externally-excited inverter circuit with the DC voltage when a control signal is input; a backlight that radiates light from behind the liquid crystal panel with a discharge lamp that is lit by the externally-excited inverter circuit; and a microcomputer that generate the control signal, a command signal that instructs to turn on oscillation and a luminance control signal that designates a duty; the liquid crystal television receives a television broadcast signal having a video signal, with the video signal generating a drive signal to drive the liquid crystal panel to display an image on screen, the externally-excited inverter circuit, comprising: a smoothing circuit that outputs a smooth voltage obtained by removing a pulsating flow from an input DC voltage, a switching circuit having a full-bridge circuit that is constructed by coupling a first half-bridge connection and a second half-bridge connection, in each of which the smooth voltage is input to one end of the half-bridge connection and another end is grounded, that applies an AC voltage to the primary winding of a transformer; a driving circuit that performs switching control of each MOS-FET constituting the full-bridge circuit, the switching control is at a frequency of a input frequency signal; a dimming control circuit that generates the frequency signal at a duty cycle corresponding to the luminance control signal when the command signal and the luminance control signal are input, and that outputs the frequency signal to the driving circuit, an inspection auxiliary circuit that outputs a first voltage to the power supply circuit as the control signal, that outputs a second voltage to the dimming control circuit as the command signal and that outputs a third voltage to the dimming control circuit as the luminance control signal; the inspection auxiliary circuit comprising; an input terminal for providing a power supply voltage from outside of the liquid crystal television; a constant voltage power supply circuit that produces the control signal, the command signal and the luminance control signal when the power supply voltage is provided from the input terminal; a first diode that connects the constant voltage power supply circuit and the power supply circuit and prevents reverse current flow from the power supply circuit to the constant voltage power supply circuit, and a second diode that connects the constant voltage power supply circuit and the dimming control circuit and prevents reverse current flow from the dimming control circuit to the constant voltage power supply circuit, the constant voltage power supply circuit comprising a transistor, a resistor that self-biases the transistor, a first Zener diode with a cathode that is coupled with the base of the transistor and an anode that is grounded to determine a base voltage, and a second Zener diode with a cathode that is coupled with a collector of the transistor and an anode that is grounded to determine the upper limit of a collector voltage of the transistor.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

For purposes of illustration, programs and other executable program components are illustrated herein as discrete blocks, although it is recognized that such programs and components may reside at various times in different storage components, and are executed by the data processor(s) of the computers.

An embodiment of the present invention will be described below in the order mentioned below.

(1) Constitution of liquid crystal television:

(2) Constitution of inverter circuit:

(3) Constitution of inspection auxiliary circuit:

(4) Conclusion:

(1) CONSTITUTION OF LIQUID CRYSTAL TELEVISION

Figure 1:
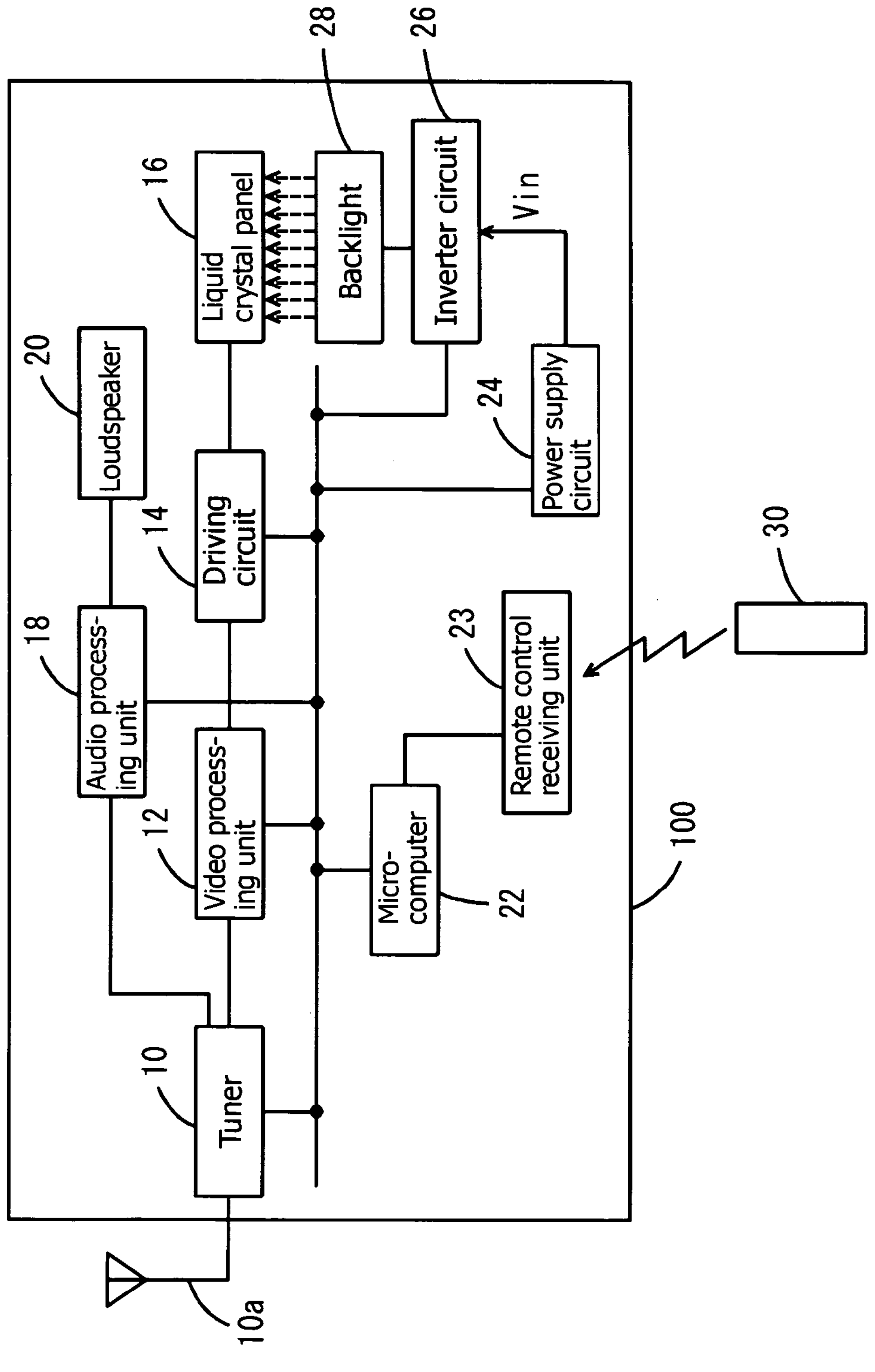
FIG. 1 is a block diagram showing a structural outline of the liquid crystal television according to this embodiment.

An embodiment of the present invention will be described below with reference to FIGS. 1 to 5. In this embodiment, a liquid crystal television comprising an inverter circuit as an optical source lighting circuit and a microcomputer as a control unit is described as an example display device. FIG. 1 is a block diagram showing a structural outline of the liquid crystal television according to this embodiment. In this Fig., the descriptions of portions that do not directly relate to the present invention are omitted. It should be noted that a liquid crystal television is described as an example in this embodiment, but of course the present invention is not limited to this constitution, and can be applied to any display device that comprises a plurality of circuits including an optical source lighting circuit.

A liquid crystal television 100 comprises a tuner 10 that receives a television broadcast signal with a selected frequency, an video processing unit 12 that subject a video signal extracted from the television broadcast signal to various video processes, an audio processing unit 18 that subjects an audio signal extracted from the television broadcast signal to various audio processes and outputs the audio signal to a loudspeaker 20, a driving circuit 14 that produces a drive signal based on the video signal to drive a liquid crystal panel 16, a microcomputer 22 that controls the entire liquid crystal television 100, a remote control receiver 23 that receives a remote control signal from a remote controller 30 and outputs a corresponding voltage signal to the microcomputer 22, a backlight 28 that radiates light from behind the liquid crystal panel 16 by a plurality of fluorescent tubes, an inverter circuit 26 that provides an AC voltage which turns the backlight 28 on, and a power supply circuit 24 which produces various kinds of voltages from AC power supply such as commercial power supply and provides each component of the liquid crystal television 100 with power supply voltages.

More specifically, the tuner 10 receives a television broadcast signal with a predetermined frequency via an antenna 10*a* by the control of the microcomputer 22, extracts a video signal and an audio signal as intermediate frequency signals from the television broadcast signal while performing a predetermined signal amplifying process and other processes, outputs the video signal to the video processing unit 12, and simultaneously outputs the audio signal to the audio processing unit 18.

The video processing unit 12 digitalizes the input video signal depending on its signal level, performs a matrix transformation process based on a luminance signal and color difference signal extracted from the video signal, and produces an RGB (red, green, blue) signal as image data. A scaling process corresponding to the number of pixels (aspect ratio, m:n) of the liquid crystal panel 16 is then performed on this RGB signal to produce image data equivalent to one screen display on the liquid crystal panel 16, and the produced image data are output to the driving circuit 14. The driving circuit produces a drive signal according to the input image data, and drives each display cell of the liquid crystal panel 16 so that an image is displayed on screen.

The inverter circuit 26 is provided with a DC voltage from the power supply circuit 24, and an AC voltage with a high frequency and a high voltage is produced from this DC voltage and is provided to the backlight 28. The backlight 28 has a plurality of fluorescent tubes, and is turned on by the provided AC voltage, serving as a light source that illuminates the liquid crystal panel 16 from behind.

The microcomputer 22 is electrically connected to each component constituting the liquid crystal television 100. A CPU as a component in the microcomputer 22 uses a RAM as a work area according to each program written in a ROM that is also a component in the microcomputer 22 and controls the entire liquid crystal television 100 at the same time. The CPU, ROM and RAM are not illustrated in the Fig. An example of this control is as follow: when a voltage signal that instructs to turn on the power supply is input to the microcomputer 22 from the remote control receiver 23 by the control of the CPU, the voltage signal that turns on the power supply of the liquid crystal television 100 is input from the remote control receiver 23. Accordingly, a control signal is output to at least the power supply circuit 24, the inverter circuit 26 that is driven by a power supply voltage output from the power supply circuit 24, and to a circuit that performs a video process, respectively, whereby turning on and off of each circuit (startup and shutdown) are controlled.

In the above, the liquid crystal television 100 comprises a plurality of circuits including the power supply circuit 24, the circuit that consists of the tuner 10, video processing unit 12 and driving circuit 14 and performs video processing, the inverter circuit 26, and others. An example in which the inverter circuit 26 is employed as the circuit to be inspected by the microcomputer 22 will be described below.

(2) CONSTITUTION OF INVERTER CIRCUIT

Figure 2:
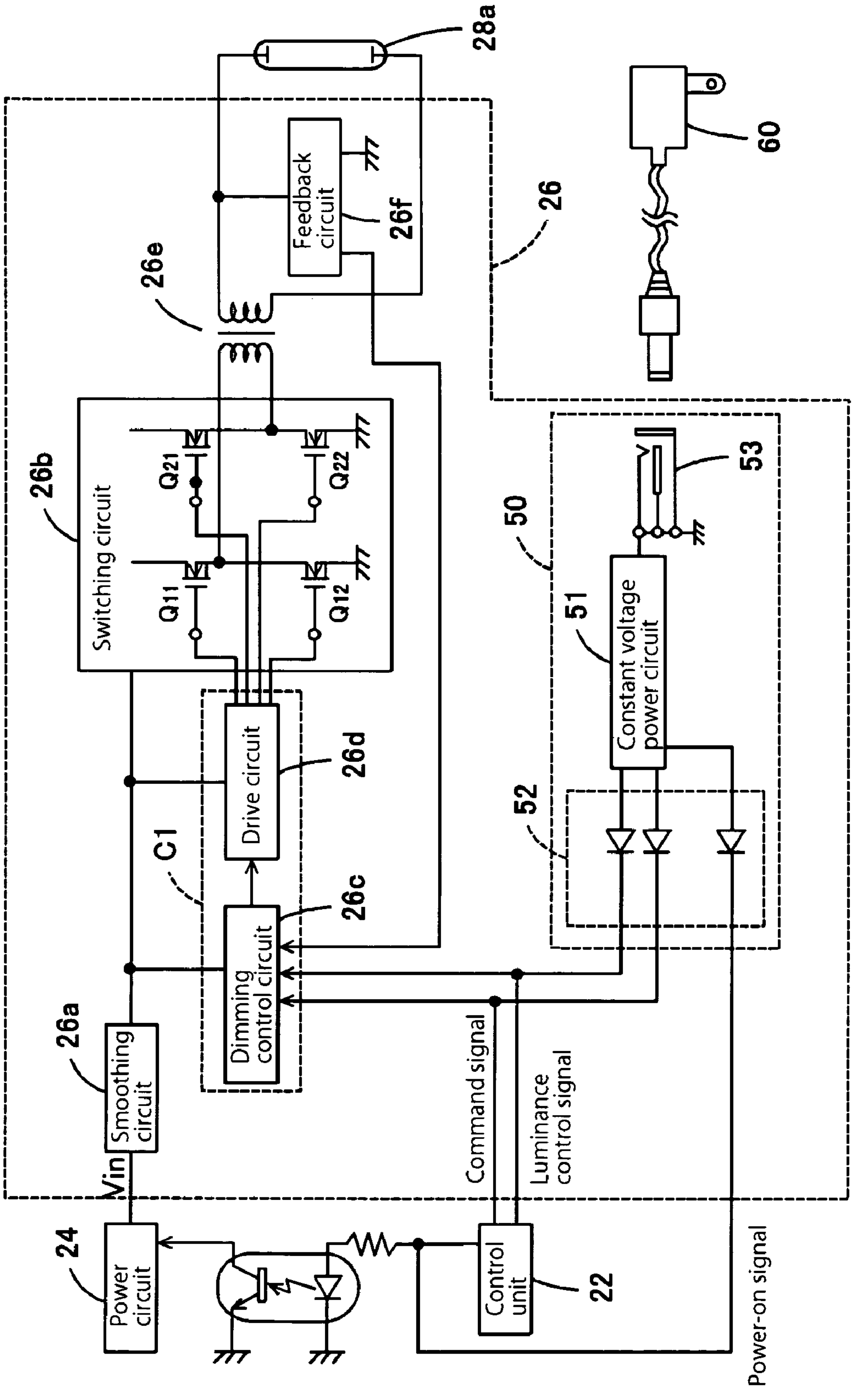
FIG. 2 is a block diagram showing the constitution of the inverter circuit.
Figure 3:
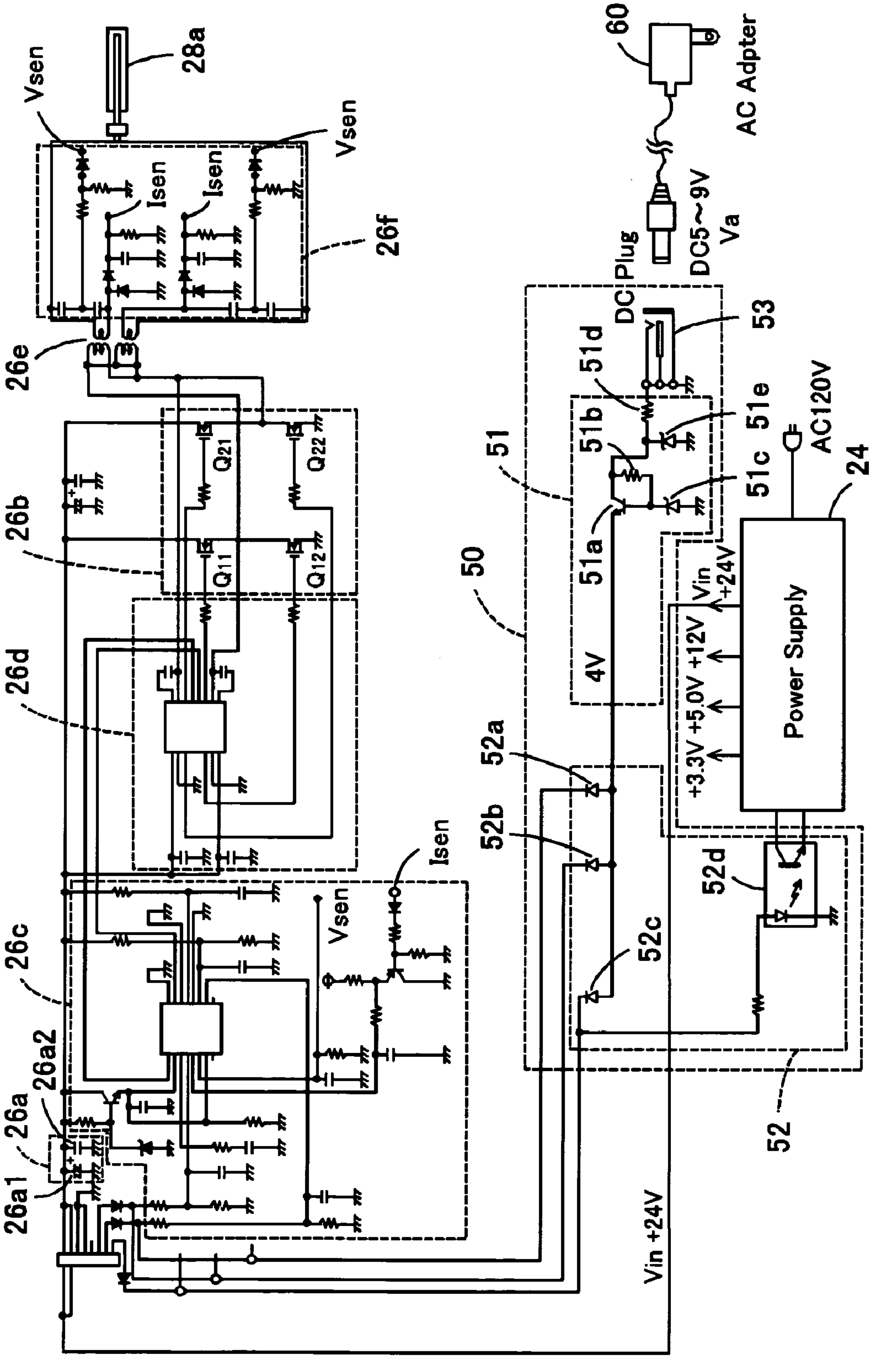
FIG. 3 is a circuit diagram of an inverter circuit according to an embodiment of the present invention.
Figure 4:
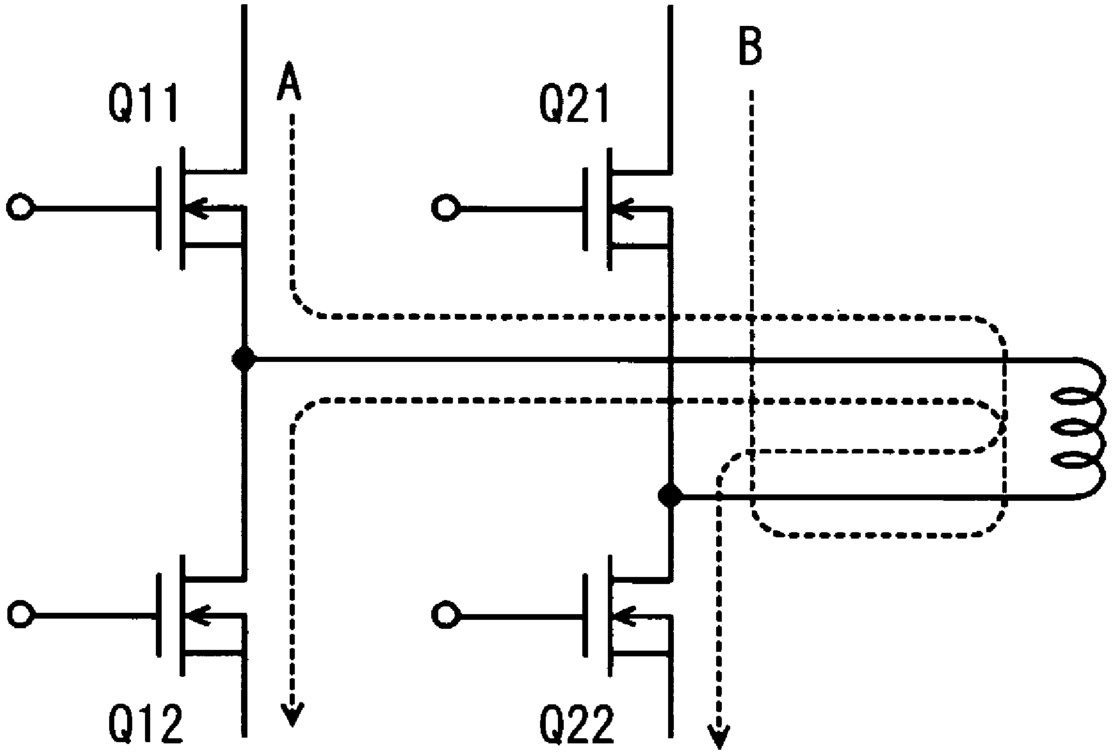
FIG. 4 is a drawing for describing the operation of the full-bridge circuit.
Figure 5:
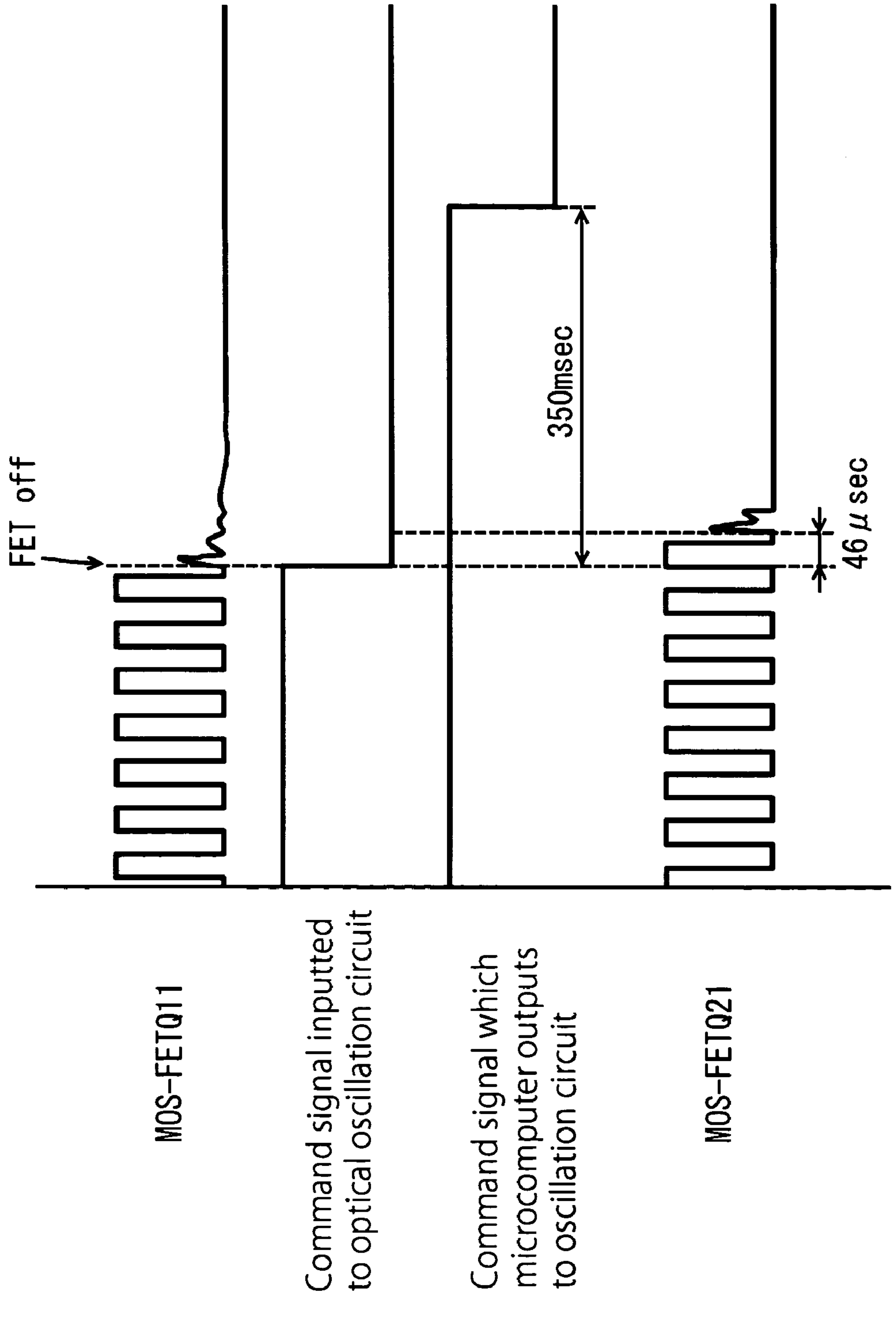
FIG. 5 is a drawing for describing phase shift control.

The inverter circuit 26 will be described below with reference to FIGS. 2 to 5. FIG. 2 is a block diagram showing of the constitution of the inverter circuit 26, and FIG. 3 is a circuit diagram of an inverter circuit according to an embodiment of the present invention. FIG. 4 is a drawing for describing the operation of the full-bridge circuit. FIG. 5 is a drawing for describing phase shift control. The inverter circuit 26 is an externally-excited inverter circuit, and produces an inverter voltage in a full-bridge circuit.

The inverter circuit 26 consists of a smoothing circuit 26*a*, a switching circuit 26*b*, a dimming control circuit 26*c*, a driving circuit 26*d*, a step-up transformer 26*e*, a feedback circuit 26*f*, and an inspection auxiliary circuit 50. The inverter circuit 26 is driven by a DC voltage Vin input from the power supply circuit 24, and produces a voltage for lighting a cold-cathode tube (discharge lamp). In FIGS. 2 and 3, the number of the switching circuit 26*b*, step-up transformer 26*e* and feedback circuit 26*f* shown are one, respectively, but of course it can be increased and decreased as the number of the cold-cathode tube 28*a* is increased and decreased. That is, the DC voltage Vin is input to the switching circuit 26*b* via the smoothing circuit 26*a*, converted into an AC voltage with a desired frequency by switching the switching element, and is fed to the cold-cathode tube via the step-up transformer 26*e*. Switching of the switching circuit 26*b* is controlled by a control circuit C1. A more specific circuit constitution will be described below.

The inverter circuit 26 comprises a smoothing circuit 26*a* consisting of capacitors 26*a*1, 26*a*2. A pulsating flow is removed from the input DC voltage Vin, and the obtained voltage is fed to the subsequent switching circuit 26*b* as a smooth voltage Ei.

The switching circuit 26*b* is an externally-excited converter constituted by full-bridge connection of four MOS-FETs Q11, Q12, Q21, and Q22. This full-bridge connection is formed by combining two half-bridge connections: one by the combination of the MOS-FETs Q11 and Q12 (first half-bridge connection); and the other by the combination of the MOS-FETs Q21 and Q22 (second half-bridge connection). In this embodiment, although MOS-FETs are used in the full-bridge circuit, but other transistor elements can be of course used.

The half-bridge connection by the combination of the MOS-FETs Q11,Q12 is formed by connecting the drain of the MOS-FET Q11 to the line of the smooth voltage Ei, connecting the source of the MOS-FET Q11 and the drain of the MOS-FET Q12, and grounding the source of the MOS-FET Q12. Similarly, the half-bridge connection by the combination of the MOS-FETs Q21,Q22 is formed by connecting the drain of the MOS-FET Q21 to the line of the smooth voltage Ei, connecting the source of the MOS-FET Q21 and the drain of the MOS-FET Q22, and grounding the source of the MOS-FET Q22.

Further, the source-drain connecting point (switching output point) of the MOS-FETs Q11, Q12 is connected to one end of the primary winding of the step-up transformer 26*e*, and the other end of the primary winding of the step-up transformer 26*e* is connected to the source-drain connecting point (switching output point) of the MOS-FETs Q21, Q22.

When a control signal that commands to turn on oscillation and a luminance control signal that designates a duty at a predetermined cycle (for example, 200 Hz) is input from the microcomputer 22 (control unit), the dimming control circuit 26*c* oscillates a frequency signal (for example, 46 kHz) according to this duty corresponding to a required switching frequency and outputs to the driving circuit 26*d*. That is, as for the luminance control signal, oscillation of the frequency signal is performed during an on-duty time, while oscillation of the frequency signal is not performed during an off-duty time. For example, the duty is 100% when displaying with a maximum luminance is selected, and the dimming control circuit 26*c* is constantly oscillating the frequency signal at this time. The driving circuit 26*d* outputs a switching drive signal to the gates of the MOS-FETs Q11, Q12, Q21, Q22 according to the oscillated frequency signal. This dimming control circuit 26*c* and the driving circuit 26*d* constitute the control circuit.

The driving circuit 26*d* controls the MOS-FETs Q11, Q22 so that they are turned on and off approximately at the same timing and the MOS-FETs Q12, Q21 are turned on and off approximately at the same timing. That is, the MOS-FETs Q11, Q12 are alternately turned on and off, and the MOS-FETs Q21, Q22 are alternately turned on and off. However, the timing of turning on and off of the MOS-FETs Q11,Q22 and the timing of turning on and off of the MOS-FETs Q12, Q21 may be shifted within the range of a half cycle of the switching frequency due to the phase shift control described later.

Since the MOS-FETs Q12,Q21 are off when the MOS-FETs Q11,Q22 are on, a current flows in the order of a path A (MBS-FET Q11 □primary winding of the step-up transformer □MOS-FET Q22 □ground) in FIG. 4. On the other hand, since the MOS-FETs Q11,Q22 are off when the MOS-FETs Q12, Q21 are on, a current flows in the order of a path B (MOS-FET Q21 □primary winding of the step-up transformer □MOS-FET Q12 □ground) in FIG. 4. In such a manner, the switching circuit 26*b* carries out a switching operation by the full-bridge method in which an AC voltage (voltages of inverted phases occurring alternately) is applied to the primary winding of the step-up transformer.

Moreover, the feedback circuit 26*f* outputs a feedback signal at a level corresponding to a change in a secondary voltage E2 (for example, tube voltage) and a secondary side current I2 (for example, tube current) to the dimming control circuit 26*c*. For example, in the feedback circuit 26*f* that feeds a tube voltage back, as shown in FIG. 3, a voltage obtained by splitting the secondary voltage of the step-up transformer 26*e* by a splitting capacitor to reduce to a predetermined ratio is used. Moreover, in the feedback circuit 26*f* that feeds the tube current back, as shown in FIG. 3, a current obtained by rectifying the secondary current of the step-up transformer 26*e* by the diode and removing a pulsating flow by the capacitor is used.

In the dimming control circuit 26*c*, phase shift control as shown in FIG. 5 is carried out based on the feedback signal so that the on-duty ratio of the switching circuit 26*b* is made variable. More specifically, control is performed to produce a phase difference between the switching frequencies of the MOS-FET Q11 and the MOS-FET Q12, and between the switching frequencies of the MOS-FET Q21 and the MOS-FET Q22, respectively. For example, when the secondary current I2 is small, the dimming control circuit 26*c* increases the on-duty ratio of the switching circuit 26*b*. That is, the driving circuit 26*d* performs a control operation so that the time during which the MOS-FET Q11 and MOS-FET Q21 are concurrently on and the time during which the MOS-FET Q21 and MOS-FET Q12 are concurrently on are lengthened. As a result, constant current control to increase the duty of the voltage that is transmitted to the secondary side is carried out.

(3) CONSTITUTION OF INSPECTION AUXILIARY CIRCUIT

The inspection auxiliary circuit 50 is briefly a circuit that produces a plurality of control signals from the power supply voltage input from an AC adapter 60 and outputs the signals. The plurality of control signals include at least a control signal that instructs to output the power supply voltage to the power supply circuit 24, a command signal that commands the dimming control circuit 26*c* to turn on oscillation, and a luminance control signal that instructs the dimming control circuit to perform a duty to oscillate at a predetermined frequency. That is, only the inverter circuit 26 and power supply circuit 24 are operated by generating and outputting these control signals. The inverter circuit 26 has no failure if the backlight 28 is lit when these control signals are output, while it can be judged that either of the inverter circuit 26, backlight 28 and power supply circuit 24 has a failure if the backlight is not lit even when the control signals are output. The inspection auxiliary circuit 50 for performing inspection of the inverter circuit 26 will be described below with reference to FIG. 3.

The inspection auxiliary circuit 50 is connected to an input terminal 53 for providing a power supply voltage by connecting the AC adapter 60 and the like from the outside of the liquid crystal television 100, a line that transmits a command signal to the dimming control circuit 26*c*, a line that transmits a luminance control signal to the dimming control circuit 26*c*, and to a line that transmits a control signal for instructing the power supply circuit 24 to output the power supply voltage, and is constituted by a constant voltage power supply circuit 51 and a reverse current protection circuit 52 for preventing a reverse current to the constant voltage power supply circuit 51.

More specifically, the constant voltage power supply circuit 51 comprises a transistor 51*a*, a resistor 51*b* that self-biases the transistor 51*a*, a Zener diode 51*c* (first Zener diode) whose cathode is connected to the base of the transistor 51*a* and anode is grounded to determine a base voltage, a resistor 51*d* that decreases a voltage Va input from the AC adapter 60 to input to the collector of the transistor 51*a*, and a Zener diode 51*e* (second Zener diode) whose cathode is connected to the collector of the transistor 51*a* and anode is grounded to determine the upper limit of a collector voltage.

The Zener diode 51*e* is selected so that it breaks down when the voltage Va input from the input terminal 53 becomes higher than a predetermined voltage (for example, 9 V). In contrast, the Zener diode 51*c* is set so that it breaks down with a voltage obtained by subtracting the base-emitter voltage VBE of the transistor 51*a* from the output voltage Vb (for example, 4 V) of the constant voltage power supply circuit 51.

The reverse current protection circuit 52 comprises diodes 52*a*, 52*b*, 52*c* that connect the emitter of the transistor 51*a* and the transmission line of each control signal to prevent a reverse current from the transmission lines to the transistor 51*a*, and a photocoupler 52*d* that electrically disconnects the transistor 51*a* and power supply circuit 24 while transmitting a control signal to the power supply circuit 24.

The inspection auxiliary circuit performs the following operation by the constitution described above:

When a voltage of 9 V or lower is input from the AC adapter 60 to the input terminal 53, the transistor 51*a* is turned on by the self-bias of the resistor 51*b*, and a voltage of 4 V is output from the constant voltage power supply circuit 51. This output voltage is input to the dimming control circuit 26*c* via the diodes 52*a*, 52*b* (second diode), and to the power supply circuit 24 via the diode 52*c* (first diode), respectively. Moreover, the power supply circuit 24 and the inspection auxiliary circuit are electrically disconnected by the photocoupler 52*d*. At this time, it is considered that the power supply circuit 24 is plugged to a commercial AC power supply in advance.

At this time, if there is no failure in the inverter circuit 26 and power supply circuit 24, the power supply circuit 24 starts outputting the power supply voltage, and the inverter circuit 26 starts outputting the inverter voltage. That is, the dimming control circuit 26*c* receives the DC voltage Vin input from the power supply circuit, and also receives a command signal and a luminance control signal input thereinto to produce a required frequency signal. This frequency signal is input to the driving circuit 26*d* that then performs switch control of the switching circuit 26*b*. A secondary voltage is output from the step-up transformer 26*e* to light the backlight 28. Thus, the inspector can confirm that there is no failure in the inverter circuit 26 and power supply circuit 24 and the cold-cathode tube of the backlight 28 is not burnt out.

In contrast, when the inverter circuit 26 has a failure, the secondary voltage is not output because the oscillation of the dimming control circuit 26*c* is not started and switch control of the driving circuit 26*d* is not performed, and therefore the backlight is not lit. Moreover, when the power supply circuit 24 has a failure, a DC voltage cannot be fed to the inverter circuit 26, and therefore the secondary voltage is not output from the inverter circuit 26. Accordingly, the inspector can confirm that at least one of the inverter circuit 26, power supply circuit 24 and backlight 28 has a failure. Hence, replacing the cold-cathode tube of the backlight 28 or other operation is carried out and the AC adapter 60 is again inserted into the input terminal 53, whereby it can be confirmed if there is any failure in the inverter circuit 26 and power supply circuit 24.

(4) CONCLUSION

That is, the liquid crystal television 100 comprising a microcomputer 22 that controls turning on and off of each circuit by outputting a control signal to a plurality of circuits, respectively, including the power supply circuit 24 that produces and outputs various power supply voltages from an inputted commercial AC power supply, at least the power supply circuit 24, and to the inverter circuit 26 that is driven by the power supply voltage output by the power supply circuit 24, is provided with an input terminal 53 for providing a power supply voltage from the outside of the liquid crystal television 100, and the inspection auxiliary circuit 50 that is connected to the power supply circuit 24 and inverter circuit 26, and generates a constant voltage that starts the power supply circuit 24 and inverter circuit 26 when a power supply voltage is provided from the input terminal 53 to output as a control signal. Therefore, it becomes possible to readily determine which circuit, among the plurality of circuits including the optical source lighting circuit and the power supply circuit, has a failure so that the circuit can be easily repaired in a short period.

It is to be understood that the present invention is not limited to the above examples. It should be obvious for a person of skill in the art that the followings are disclosed as examples of the present invention:

suitably applying the components, constitutions and the like disclosed in the above examples and are interchangeable with each other in different combinations suitably replacing the components, constitutions and the like disclosed in the above examples with interchangeable components, constitutions and the like that are not disclosed in the above examples but are known techniques, and applying the same in different combinations suitably replacing the components, constitution and the like disclosed in the above examples with those which are not disclosed in the above examples but can be anticipated as substitutes for the same by a person of skill in the art based on known techniques, and applying the same in different combinations While the invention has been particularly shown and described with respect to preferred embodiments thereof, it should be understood by those skilled in the art that the foregoing and other changes in form and detail may be made therein without departing from the sprit and scope of the invention as defined in the appended claims.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A display device, comprising a power supply circuit that enables supply of a plurality of voltages from a power source;

a control unit that outputs control signals to a plurality of circuits to respectively turn ON and OFF the plurality of circuits;

the plurality of circuits comprising at least the power supply circuit and an inverter circuit that is driven by a power supply voltage;

an inspection auxiliary circuit that generates inspection signals that are input to the plurality of circuits to inspect an operability of the plurality of circuits, with the generated inspection signals mimicking the control signals that would have been generated from the control unit during normal operation of the display device for normal operation of the plurality of circuits;

the inspection circuit is comprised of:

a constant voltage power circuit that generates the inspection signals in a form of a constant voltage; and a backflow preventer circuit that is forward biased to block and prevent signal leakage to inspection auxiliary circuit.

2. A display device according to claim 1, wherein the constant voltage power circuit and the power supply circuit are connected by a first diode so that reverse current from the power supply circuit to the constant voltage power circuit is prevented, and the constant voltage power circuit and the inverter circuit are connected by a second diode so that reverse current from the inverter circuit to the constant voltage power circuit is prevented.

3. A display device according to claim 1, wherein the constant voltage power circuit comprises a transistor, a resistor that self-biases the transistor, and a first Zener diode having a cathode that is connected to the base of the transistor and an anode that is grounded to determine a base voltage.

4. A display device according to claim 3, wherein a second Zener diode having a cathode that is connected to a collector of the transistor and an anode that is grounded to determine an upper limit of a collector voltage of the transistor is provided.

5. A display device according to claim 1, wherein the display device is a liquid crystal television comprising the inverter circuit and a backlight that is lit by inverter circuit, the inverter circuit constituting the optical source lighting circuit comprises a switching circuit that applies an AC voltage to a primary winding of a transformer, and a control circuit that oscillates a predetermined frequency signal at a duty corresponding to a luminance control signal when a control signal that commands to turn on oscillation and the luminance control signal that designates a duty are input to the control circuit, and performs switching control of the switching circuit at a frequency of the frequency signal; and the inspection auxiliary circuit outputs inspection signals that mimic control signal to the power supply circuit and mimic and output luminance control signal to the control circuit.

6. A liquid crystal television, comprising:

an externally-excited inverter circuit that converts a direct current (DC) input voltage into an alternate current (AC) output voltage;

a power supply circuit that provides the externally-excited inverter circuit with the DC voltage;

a backlight that radiates light from behind the liquid crystal panel with a discharge lamp that is lit by the externally-excited inverter circuit; and a microcomputer that generates a control signal to a control circuit, including a command signal and a luminance control signal;

the liquid crystal television receives a television broadcast signal having a video signal that is input to the liquid crystal panel to display an image on screen, the externally-excited inverter circuit, comprising:

a smoothing circuit that outputs a smooth voltage, a switching circuit having a full-bridge circuit that receives the smooth voltage and applies an AC voltage to a primary winding of a transformer;

a driving circuit that performs switching control of the switching circuit;

a dimming control circuit that generates a signal at a duty cycle corresponding to the luminance control signal when the command signal and the luminance control signal are input, and outputs the signal to the driving circuit, an inspection auxiliary circuit that outputs a first voltage to the power supply circuit as the control signal, that outputs a second voltage to the dimming control circuit as the command signal and that outputs a third voltage to the dimming control circuit as the luminance control signal;

the inspection auxiliary circuit comprising;

an input terminal for providing a power supply voltage from outside of the liquid crystal television;

a constant voltage power supply circuit that produces the control signal, the command signal and the luminance control signal when the power supply voltage is provided from the input terminal;

a first diode that connects the constant voltage power supply circuit and the power supply circuit and prevents reverse current flow from the power supply circuit to the constant voltage power supply circuit, and a second diode that connects the constant voltage power supply circuit and the dimming control circuit and prevents reverse current flow from the dimming control circuit to the constant voltage power supply circuit, the constant voltage power supply circuit comprising a transistor, a resistor that self-biases the transistor, a first Zener diode with a cathode that is coupled with a base of the transistor and an anode that is grounded to determine a base voltage, and a second Zener diode with a cathode that is coupled with a collector of the transistor and an anode that is grounded to determine the upper limit of a collector voltage of the transistor.

* * * * *